US008816348B2

United States Patent
Hsieh

(10) Patent No.: US 8,816,348 B2
(45) Date of Patent: *Aug. 26, 2014

(54) SHIELDED GATE MOSFET-SCHOTTKY RECTIFIER-DIODE INTEGRATED CIRCUITS WITH TRENCHED CONTACT STRUCTURES

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 440 days.

This patent is subject to a terminal disclaimer.

(21) Appl. No.: 13/186,615

(22) Filed: Jul. 20, 2011

(65) Prior Publication Data

US 2013/0020576 A1   Jan. 24, 2013

(51) Int. Cl.
*H01L 27/06* (2006.01)

(52) U.S. Cl.
USPC .............. 257/66; 257/334; 257/E27.016

(58) Field of Classification Search
USPC ............ 257/66, E27.016, 155, 334, 341, 331, 257/342, E27.034

See application file for complete search history.

(56) References Cited

U.S. PATENT DOCUMENTS 8,569,765 B2 * 10/2013 Hsieh .............................. 257/66

* cited by examiner

*Primary Examiner* — Roy Potter
(74) *Attorney, Agent, or Firm* — Bacon & Thomas, PLLC

(57) ABSTRACT

A trench shielded gate MOSFET device with embedded Schottky rectifier, Gate-Drain and Gate-Source clamp diodes on single chip is formed to achieve device shrinkage, lower cost and improved performance. The present semiconductor device achieve low Vf and reverse leakage current for embedded Schottky rectifier, having over-voltage protection and avalanche protection between gate and source and between gate and drain.

39 Claims, 9 Drawing Sheets

US 8,816,348 B2

SHIELDED GATE MOSFET-SCHOTTKY RECTIFIER-DIODE INTEGRATED CIRCUITS WITH TRENCHED CONTACT STRUCTURES

FIELD OF THE INVENTION

This invention relates generally to the cell structure, device configuration and fabricating method of power semiconductor devices. More particularly, this invention relates to an improved cell configuration to manufacture trench shielded gate MOSFET (Metal Oxide Semiconductor Field Effect Transistor) with Schottky rectifier diode, Gate-Drain (GD) and Gate-Source (GS) clamp diode on single chip for device shrinkage and performance improvement.

BACKGROUND OF THE INVENTION

Please refer to FIG. 1, normally for high efficiency DC/DC application, a Schottky rectifier is externally added in parallel with a MOSFET device to prevent a parasitic P/N body diode in the MOSFET from turning on in order to achieve higher speed and efficiency. The requirement for clamping effect is that the forward voltage of the Schottky rectifier Vf is less than the parasitic P/N body diode (~0.7V). Besides, for providing effective ESD (electrostatic discharge) protection between gate (G, as illustrated in FIG. 1) and source (S, as illustrated in FIG. 1) and between gate and drain (D, as illustrated in FIG. 1), plurality poly-silicon Zener diodes are respectively implemented therein with breakdown voltage lower than that of the MOSFET device for clamping voltage between gate and source, and between gate and drain for avalanche protection. However, assembly of those separate structures into single package with extra interconnection wires results in higher manufacturing cost, and poor performance due to increase in inductance from the extra interconnection wires.

Accordingly, it would be desirable to provide more integrated MOSFET device with embedded Schottky rectifier diode, Gate-Drain and Gate-Source clamp diodes on single chip for device shrinkage and performance improvement.

SUMMARY OF THE INVENTION

It is therefore an aspect of the present invention to provide improved semiconductor power device configuration for providing an integrated circuit comprising trench MOSFET with embedded Schottky rectifier, Gate-Drain clamp diode and Gate-Source clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; a Schottky rectifier extending into the epitaxial layer and having a Schottky barrier layer lined in a trenched anode contact filled with a contact metal plug; a Gate-Drain clamp diode comprising multiple back to back poly-silicon Zener diodes with alternating doped regions of the first conductivity type next to the second conductivity type, connected with the gate metal on one side and with a drain metal on another side through a plurality of metal stripes cross over a termination area; and a Gate-Source clamp diode comprising multiple back to back poly-silicon Zener diodes with alternating doped regions of the first conductivity type next to the second conductivity type, connected with the gate metal on one side, and with the source metal on another side.

It is therefore another aspect of the present invention to provide improved semiconductor power device configuration for providing an integrated circuit comprising trench MOSFET with embedded Schottky rectifier and Gate-Source clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; a Schottky rectifier extending into the epitaxial layer and having a Schottky barrier layer lined in a trenched anode contact filled with a contact metal plug; and a Gate-Source clamp diode comprising multiple back to back poly-silicon Zener diodes with alternating doped regions of the first conductivity type next to the second conductivity type, connected with the gate metal on one side, and with the source metal on another side.

It is therefore another aspect of the present invention to provide improved semiconductor power device configuration for providing an integrated circuit comprising trench MOSFET with embedded Schottky rectifier, and Gate-Drain clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; a Schottky rectifier extending into the epitaxial layer and having a Schottky barrier layer lined in a of trenched anode contact filled with a contact metal plug; and a Gate-Drain clamp diode comprising multiple back to back poly-silicon Zener diodes with alternating doped regions of the first conductivity type next to the second conductivity type, connected with the gate metal on one side and with a drain metal on another side through a plurality of metal stripes cross over a termination area.

It is therefore another aspect of the present invention to provide improved semiconductor power device configuration for providing an integrated circuit comprising trench MOSFET with Gate-Drain clamp diode and Gate-Source clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; a Gate-Drain clamp diode comprising multiple back to back poly-silicon Zener diodes with alternating doped regions of the first conductivity type next to the second conductivity type, connected with the gate metal on one side and with a drain metal on another side through a plurality of metal stripes cross over a termination area; and a Gate-Source clamp diode comprising multiple back to back poly-silicon Zener diodes with alternating doped regions of the first conductivity type next to the second conductivity type, connected with the gate metal on one side, and with the source metal on another side.

It is therefore another aspect of the present invention to provide improved semiconductor power device configuration for providing an integrated circuit comprising trench MOSFET with Gate-Source clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; and a Gate-Source clamp diode comprising multiple back to back poly-silicon Zener diodes with alternating doped regions of the first conductivity type next to the second conductivity type, connected with the gate metal on one side, and with the source metal on another side.

It is therefore another aspect of the present invention to provide improved semiconductor power device configuration for providing an integrated circuit comprising trench MOSFET with Gate-Drain clamp diode on single chip to achieve reduced die size, lower cost and improved performance. According to the present invention, the integrated circuit comprising: a substrate of a first conductivity type; an epitaxial layer of the first conductivity type over the substrate, the epitaxial layer having a lower doping concentration than the substrate; a trench MOSFET comprising a plurality of shielded trenched gates in the epitaxial layer, wherein each the shielded trenched gate comprising a gate electrode disposed in the upper portion and a shielded electrode disposed in the lower portion of a first type gate trench, wherein the gate electrode and the shielded electrode insulated from each other by an inter-electrode insulation layer; each the shielded trenched gate comprising a first type gate oxide surrounding bottom and sidewalls of the shielded electrode and a second type gate oxide along sidewalls of the gate electrode, wherein the first type gate oxide having thickness greater than the second type gate oxide; the gate electrode in the first gate trench being surrounded by a source region of the first conductivity type encompassed in a body region of a second conductivity type, the gate electrode being connected to a gate metal; the shielded electrode in the first type gate trench being surrounded by the epitaxial layer and being connected to a source metal; a Gate-Drain clamp diode comprising multiple back to back poly-silicon Zener diodes with alternating doped regions of the first conductivity type next to the second conductivity type, connected with the gate metal on one side and with a drain metal on another side through a plurality of metal stripes cross over termination area.

In some other preferred embodiments, the present invention can be implemented including one or more following features: the trench MOSFET further comprising a second type gate trench being filled with a single shielded electrode having same conductive material as the shielded electrode in the shielded trenched gates in the trench MOSFET, padded by the first type gate oxide, wherein the single shielded electrode in the second type gate trench being connected to the source metal through a trenched shielded electrode contact filled with the contact metal plug; the Schottky rectifier is a trench Schottky rectifier having a Schottky barrier layer lined in the trenched anode contact filled with the contact metal plug, and disposed between a pair of adjacent third type gate trenches, each of the third type gate trenches filled with a single shielded electrode having same conductive material as the shielded electrode in the shielded trenched gates in the trench MOSFET, padded by the first type gate oxide; the Schottky rectifier is a trench Schottky rectifier having a Schottky barrier layer lined in the trenched anode contact filled with the contact metal plug, and disposed between a pair of adjacent third type gate trenches, each of the third type gate trenches filled with a gate electrode and a shielded electrode having same conductive material and structure as the shielded trenched gates in the trench MOSFET; the Schottky rectifier is a Junction Barrier Schottky (JBS) rectifier having a Schottky barrier layer lined in the trenched anode contact filled with the contact metal plug and between a pair of the adjacent body regions; the Schottky rectifier further comprising a Schottky barrier enhancement region of the first conductivity type surrounding sidewalls and bottom of each the trenched anode contact in the epitaxial layer, the Schottky barrier height enhancement region having doping concentration lower than the epitaxial layer; the Schottky rectifier further comprises a Schottky barrier height enhancement region of the second conductivity type surrounding sidewalls and bottom of each the trenched anode contact in the epitaxial layer; the Gate-Source clamp diode being connected to the source metal through a first trenched diode contact filled with the contact metal plug, and being connected to the gate metal through a second trenched diode contact filled with the contact metal plug; the Gate-Drain clamp diode being connected to the gate metal through a third trenched diode contact filled with the contact metal plug, and being connected to the drain metal through a forth trenched diode contact filled with the contact metal plug; the integrated circuit further comprises etch-buffer trenched gates disposed in the epitaxial layer underneath each of the first, second, third and forth trenched diode contacts to serve as buffer layers for prevention of gate-body shortage.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
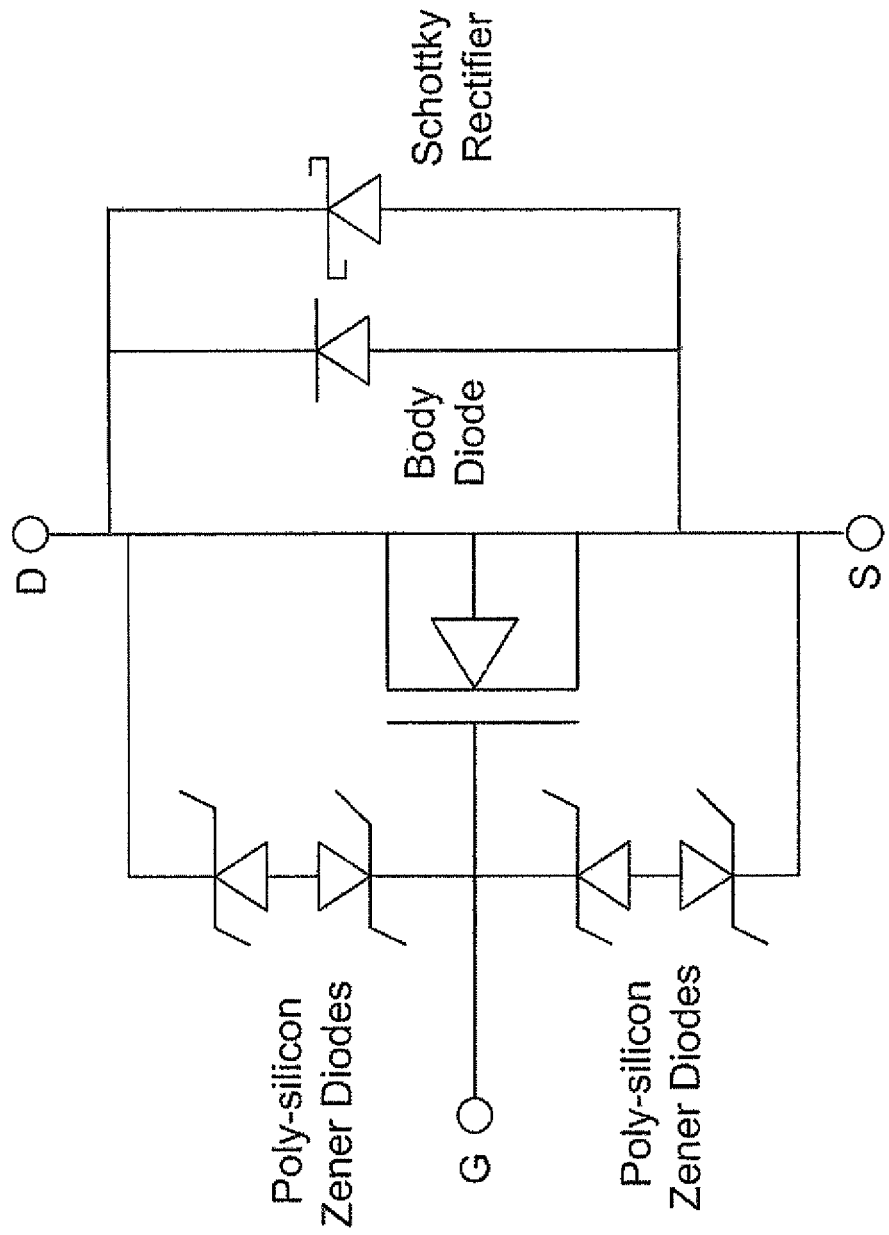
FIG. 1 is a conventional application circuit of the MOSFET power device with integration of Schottky rectifier, Gate-Drain and Gate-Source clamp diodes in single package.
Figure 2A:
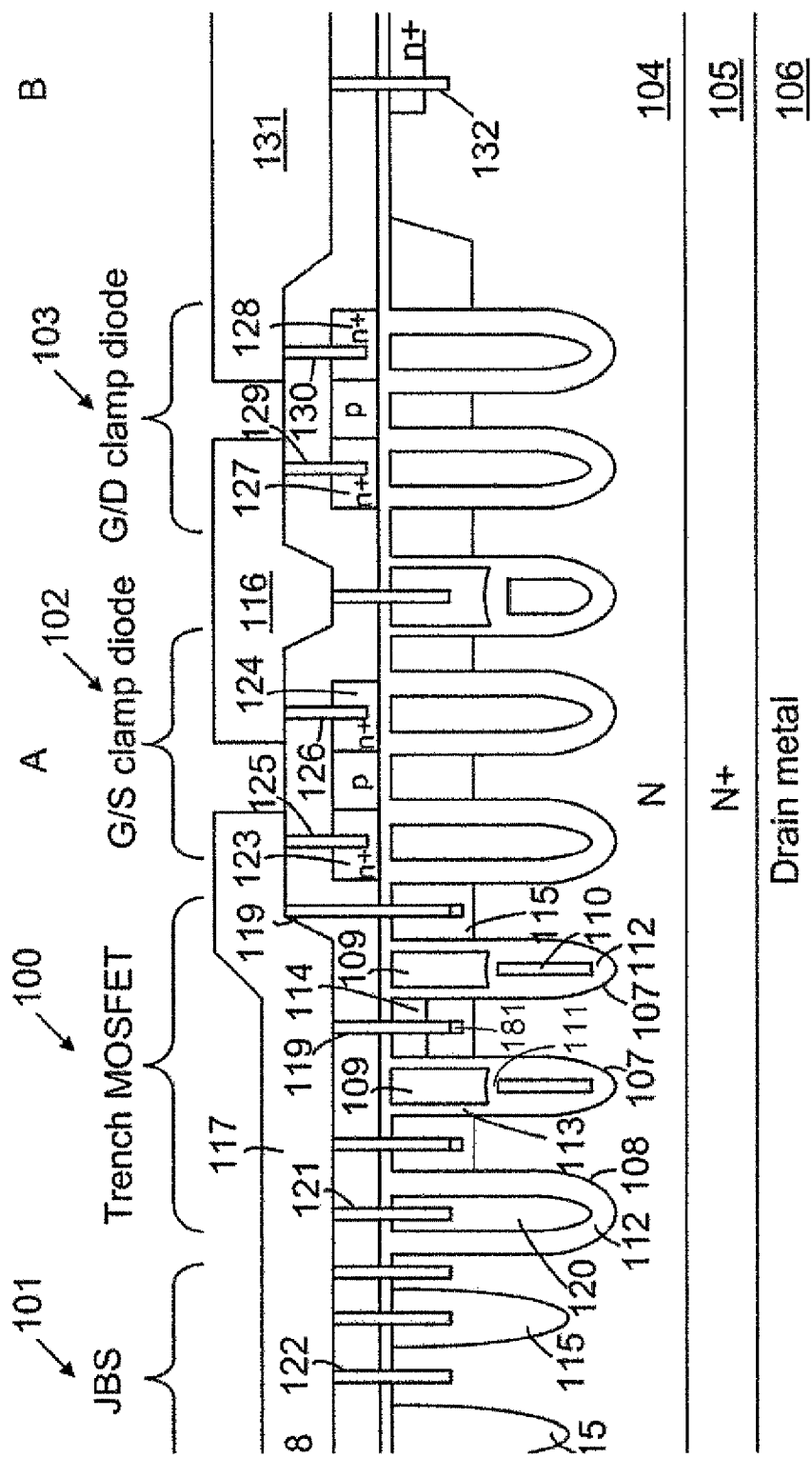
FIG. 2A is a preferred A-B cross-sectional view of an integrated circuit according to the present invention disclosed in FIG. 2C.
Figure 2B:
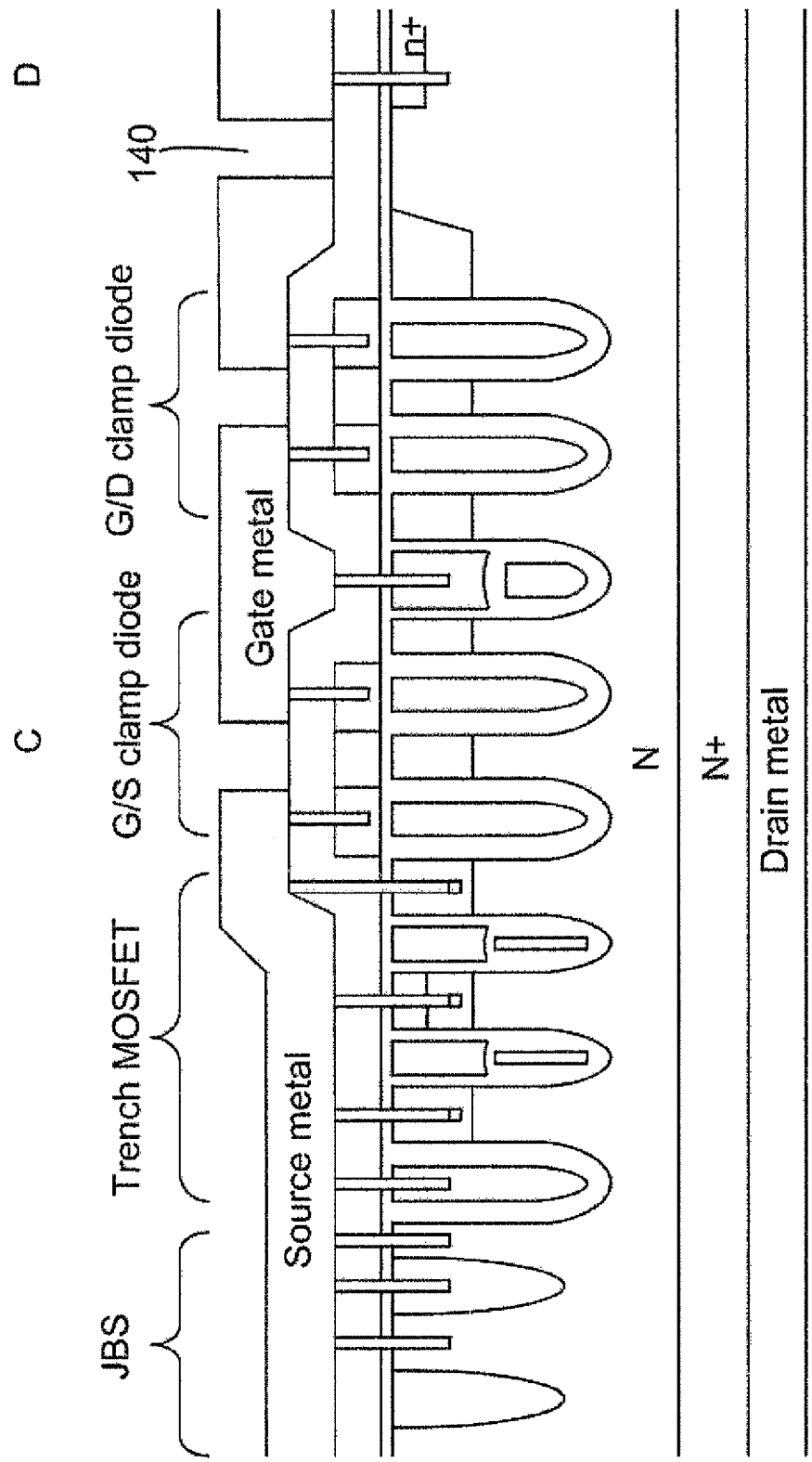
FIG. 2B is a preferred C-D cross-sectional view of an integrated circuit according to the present invention disclosed in FIG. 2C.
Figure 2C:
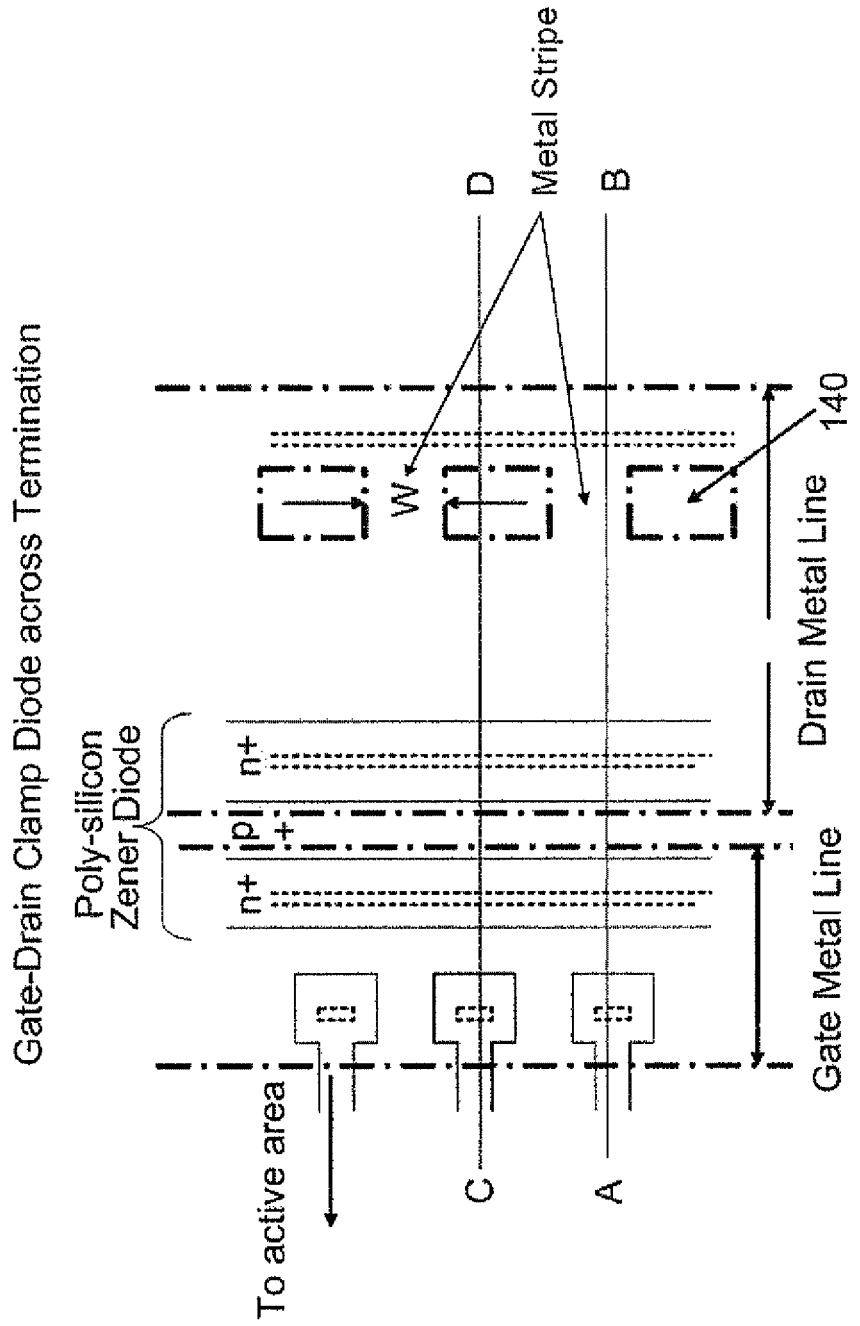
FIG. 2C is a top view of an integrated circuit of a preferred embodiment.

Please refer to FIG. 2A and FIG. 2B for a preferred embodiment of this invention which is respective A-B and C-D cross-sectional view of FIG. 2C. In FIG. 2A, an N-channel trench MOSFET 100 is implemented with Junction Barrier Schottky rectifier 101 (JBS, as illustrated), a Gate-Source clamp diode 102 (GIS clamp diode, as illustrated) and a Gate-Drain clamp diode 103 (G/D clamp diode, as illustrated) in an N epitaxial layer 104 above an N+ substrate 105 which is coated with back metal of Ti/Ni/Ag on rear side as drain metal 106. The trench MOSFET 100 further comprises a plurality of first type gate trenches 107 for shielded trenched gates and a second type gate trench 108 for shielded electrode contact, wherein each the first type gate trench 107 is filled with a gate electrode 109 in the upper portion and a shielded electrode 110 in the lower portion, wherein the gate electrode 109 is insulated from the shielded electrode 110 by an inter-electrode insulation layer 111. Besides, each the shielded trenched gate comprises a first type gate oxide 112 surrounding sidewalls and bottom of the shielded electrode 110 and a second type gate oxide 113 surrounding sidewalls of the gate electrode 109, wherein the first type gate oxide 112 has a thickness greater than the second type gate oxide 113. Furthermore, each the gate electrode 109 being connected to a gate metal 116 is surrounded by an n+ source region 114 encompassed in a P body region 115, wherein the n+ source region 114 and the P body region 115 is connected to a source metal 117 over a contact insulation layer 118 via a trenched source-body contact 119 filled with a contact metal plug, for example, tungsten plug, which has bottom surrounded by a p+ body contact region 181 to reduce contact resistance between the contact metal plug and the P body region 115. Meanwhile, each the shielded electrode 110 is surrounded by the N epitaxial layer 104 and connected to the source metal 117. The second type gate trench 108 is filled with a single shielded electrode 120 and padded by the first type gate oxide 112, wherein the single shielded electrode 120 has same conductive material as the shielded electrode 110 and is connected to the source metal 117 via a trenched shielded electrode contact 121 filled with the contact metal plug.

The Junction Barrier Schottky rectifier 101 comprises a Schottky barrier layer lined in a trenched anode contact 122 filled with the contact metal plug extending into the N epitaxial layer 104 between a pair of the P body regions 115 which is connected to the source metal 117. The Gate-Source clamp diode 102 comprises multiple back to back poly-silicon Zener diodes with alternating n+ doped regions and p doped regions, wherein the n+ doped region 123 on one side of the poly-silicon Zener diodes is connected to the source metal 117 through a first trenched diode contact 125 filled with the contact metal plug, while the n+ doped region 124 on another side of the poly-silicon Zener diodes is connected to the gate metal 116 through a second trenched diode contact 126 filled with the contact metal plug. The Gate-Drain clamp diode 103 comprises multiple back to back poly-silicon Zener diodes with alternating n+ doped regions and p doped regions, wherein the n+ doped region 127 on one side of the poly-silicon Zener diode is connected to the gate metal 116 through a third trenched diode contact 129 filled with the contact metal plug, while the n+ doped region 128 on another side of the poly-silicon Zener diode is connected to a metal stripe 131 as filed plate cross over a termination area through a forth trenched diode contact 130 which is finally connected to the drain metal 106 through a trenched drain contact 132 filled with the contact metal plug. Furthermore, underneath each of the first, second, third, and forth trenched diode contacts, a etch-buffer trenched gate having same structure as the one in the second type gate trench 108 in the trench MOSFET 100 is formed in the N epitaxial layer 104 to serve as buffer layer for prevention of gate-body shortage.

Please refer to FIG. 2B for a preferred C-D cross section of FIG. 2C. Comparing to FIG. 2A, FIG. 2B further comprises an open area 140 between the metal stripes where from electrical field comes out to avoid avalanche degradation.

Figure 3:
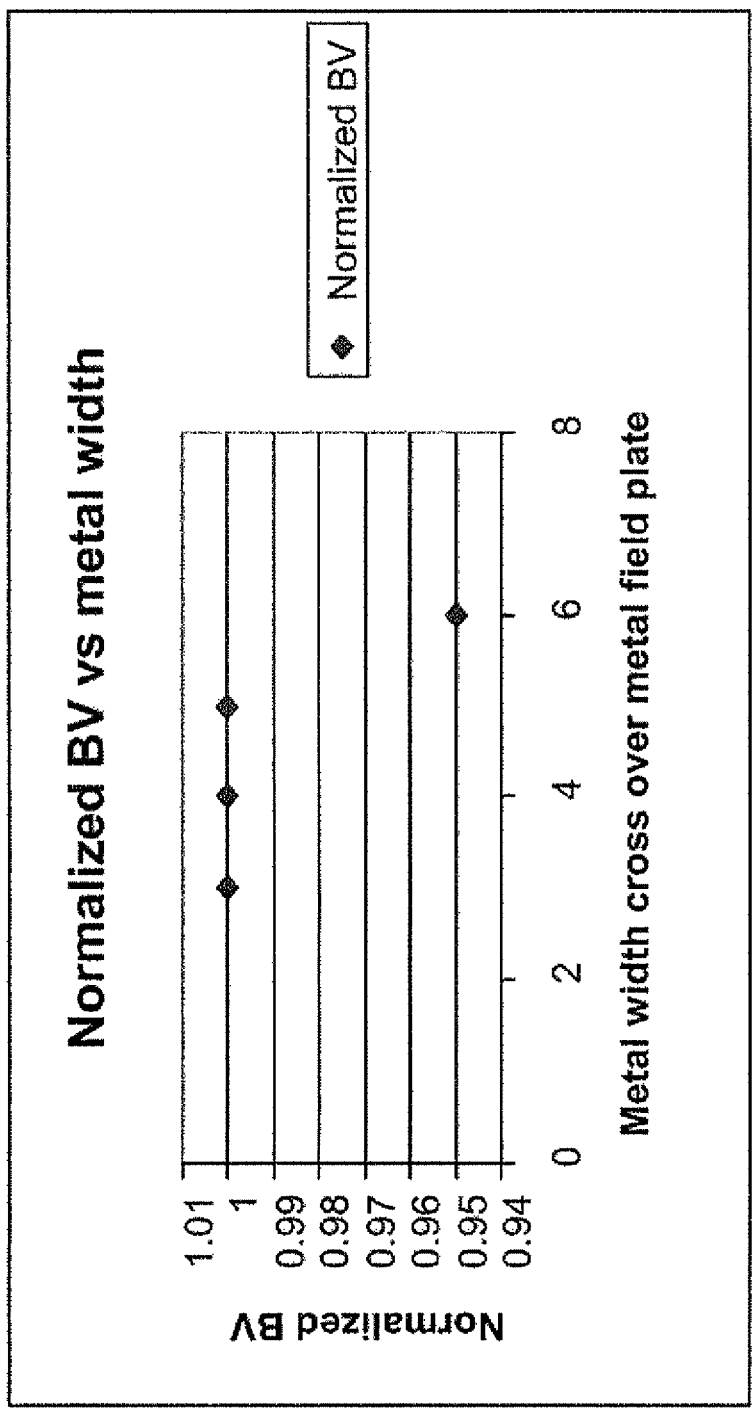
FIG. 3 is a normalized measurement result of the relationship between breakdown voltage and metal width across over field plate termination.

FIG. 2C is a top view of a preferred embodiment showing the Gate-Drain clamp diode across the termination area with the open area 140 and metal width W. Please refer to FIG. 3 for a normalized measurement result of the relationship between breakdown voltage and the metal width W showing that the breakdown voltage will be degraded when the metal width W is greater than 5um, which means that the electrical field underneath the filed plate can not effectively go through the open area 140 if the metal width is larger than 5 um.

Figure 4:
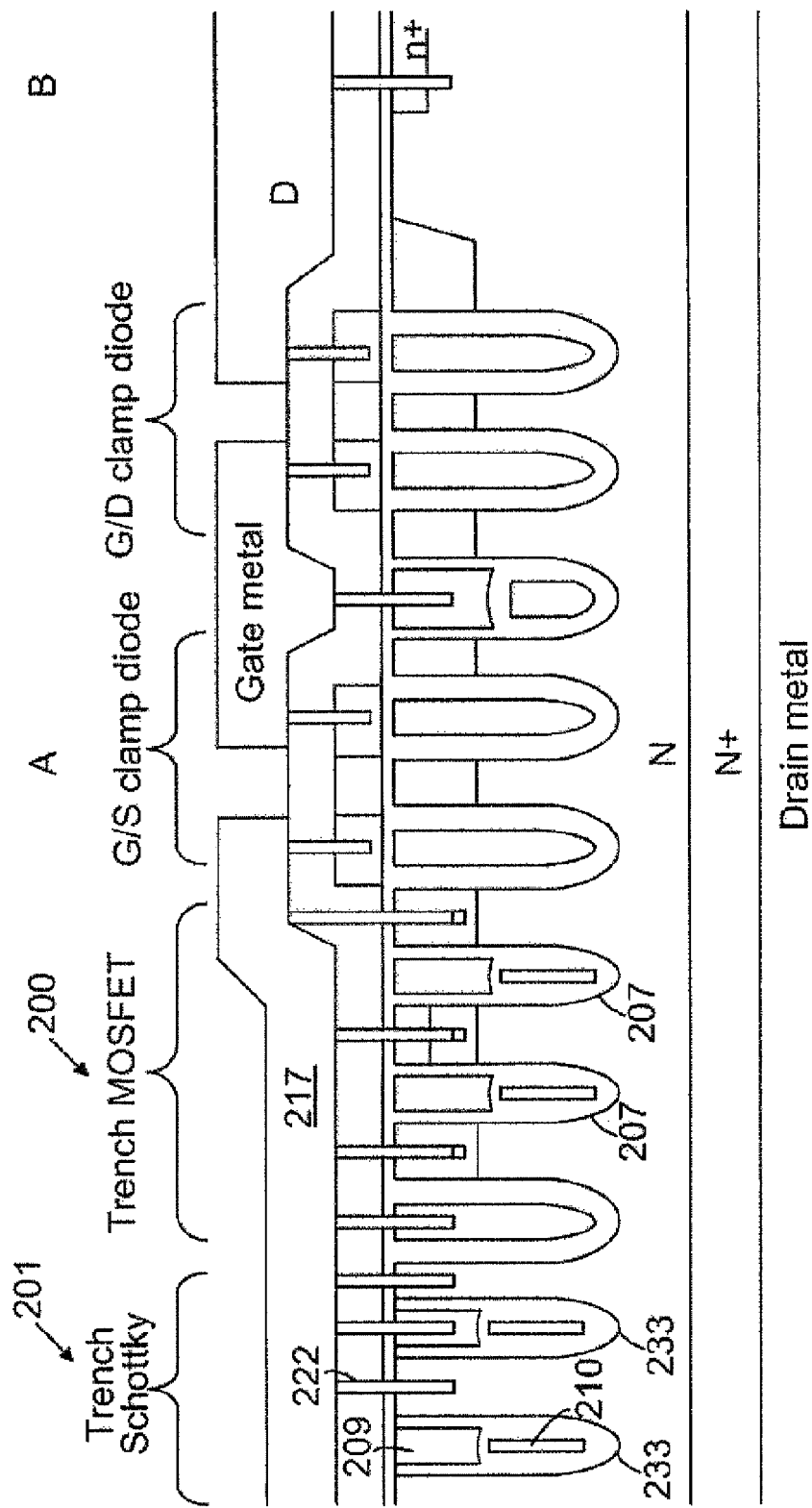
FIG. 4 is another preferred A-B cross-sectional view of an integrated circuit according to the present invention disclosed in FIG. 2C.

FIG. 4 is another preferred A-B cross section of FIG. 2C which has a similar configuration to FIG. 2A, except that, the integrated circuit in FIG. 4 comprises a trench Schottky rectifier 201 having a Schottky barrier layer lined in the trenched anode contact 222 filled with the contact metal plug and disposed between a pair of third type gate trenches 233. Each the third type gate trench 233 is filled with the gate electrode 209 in the upper portion and the shielded electrode 210 in the lower portion, having same conductive material and structure as the shielded trenched gates in the first type gate trenches 207 in the trench MOSFET 200. Meanwhile, the gate electrode 209 in the third type gate trench 233 is connected to the source metal 217.

Figure 5:
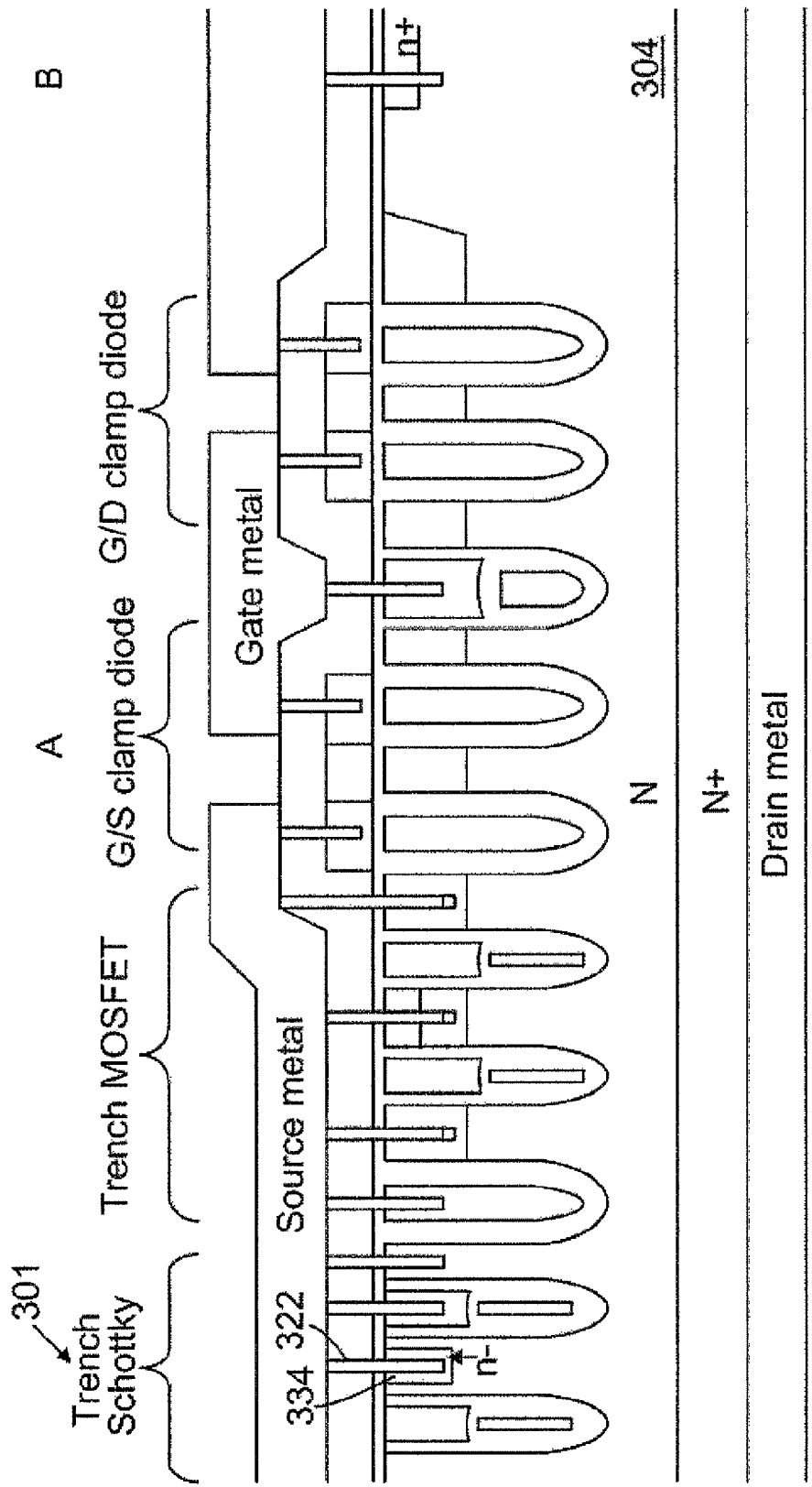
FIG. 5 is another preferred A-B cross-sectional view of an integrated circuit according to the present invention disclosed in FIG. 2C.

FIG. 5 is another preferred A-B cross section of FIG. 2C which has a similar configuration to FIG. 4, except that, the trench Schottky rectifier 301 in FIG. 5 further comprises an n− Schottky barrier height enhancement region 334 surrounding sidewalls and bottom of the trenched anode contact 322 in the N epitaxial layer 304, wherein the n− Schottky barrier height enhancement region 334 has a lower doping concentration than the N epitaxial layer 304.

Figure 6:
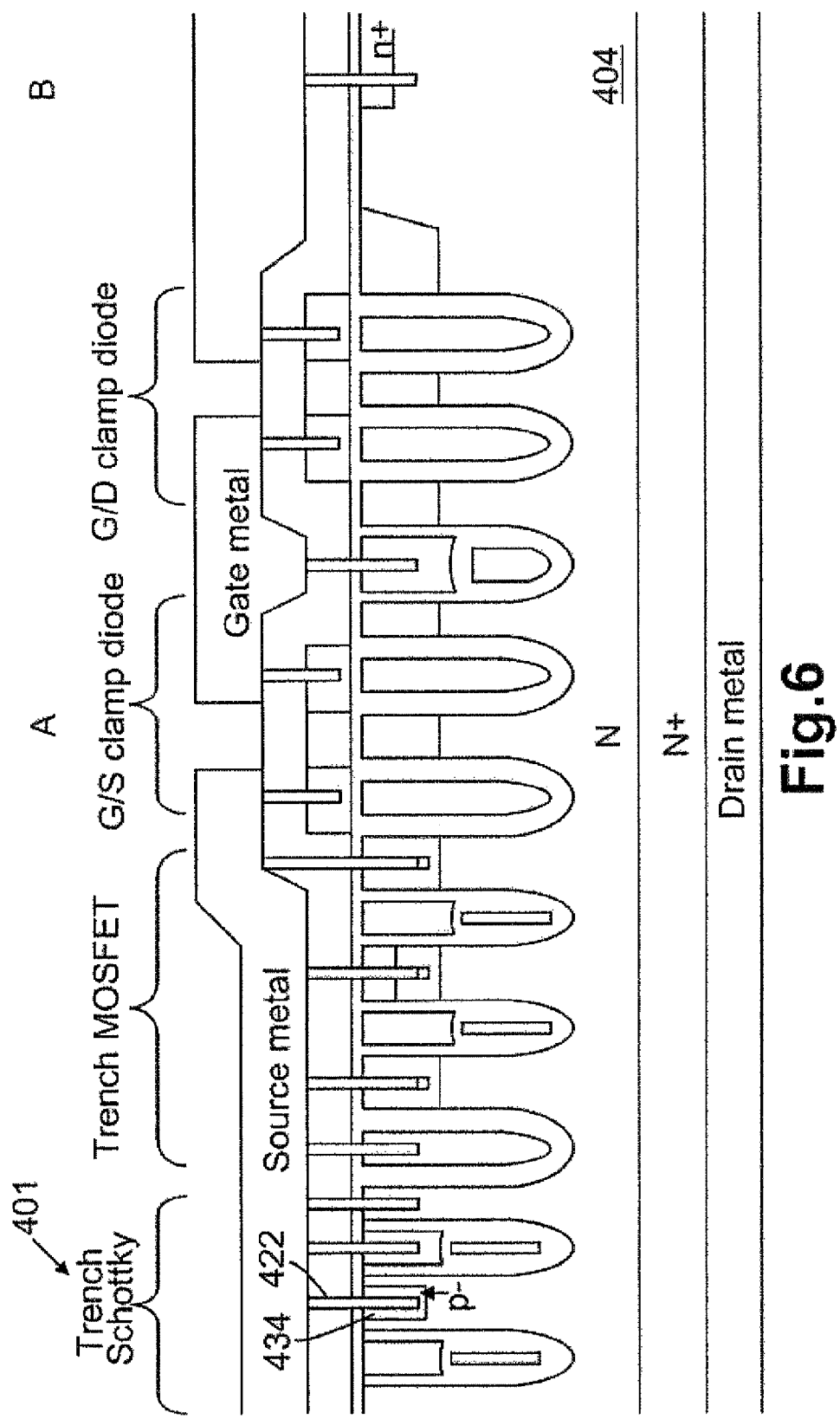
FIG. 6 is another preferred A-B cross-sectional view of an integrated circuit according to the present invention disclosed in FIG. 2C.

FIG. 6 is another preferred A-B cross section of FIG. 2C which has a similar configuration to FIG. 4, except that, the trench Schottky rectifier 401 in FIG. 6 further comprises a p− Schottky barrier height enhancement region 434 surrounding sidewalls and bottom of the trenched anode contact 422 in the N epitaxial layer 404.

Figure 7:
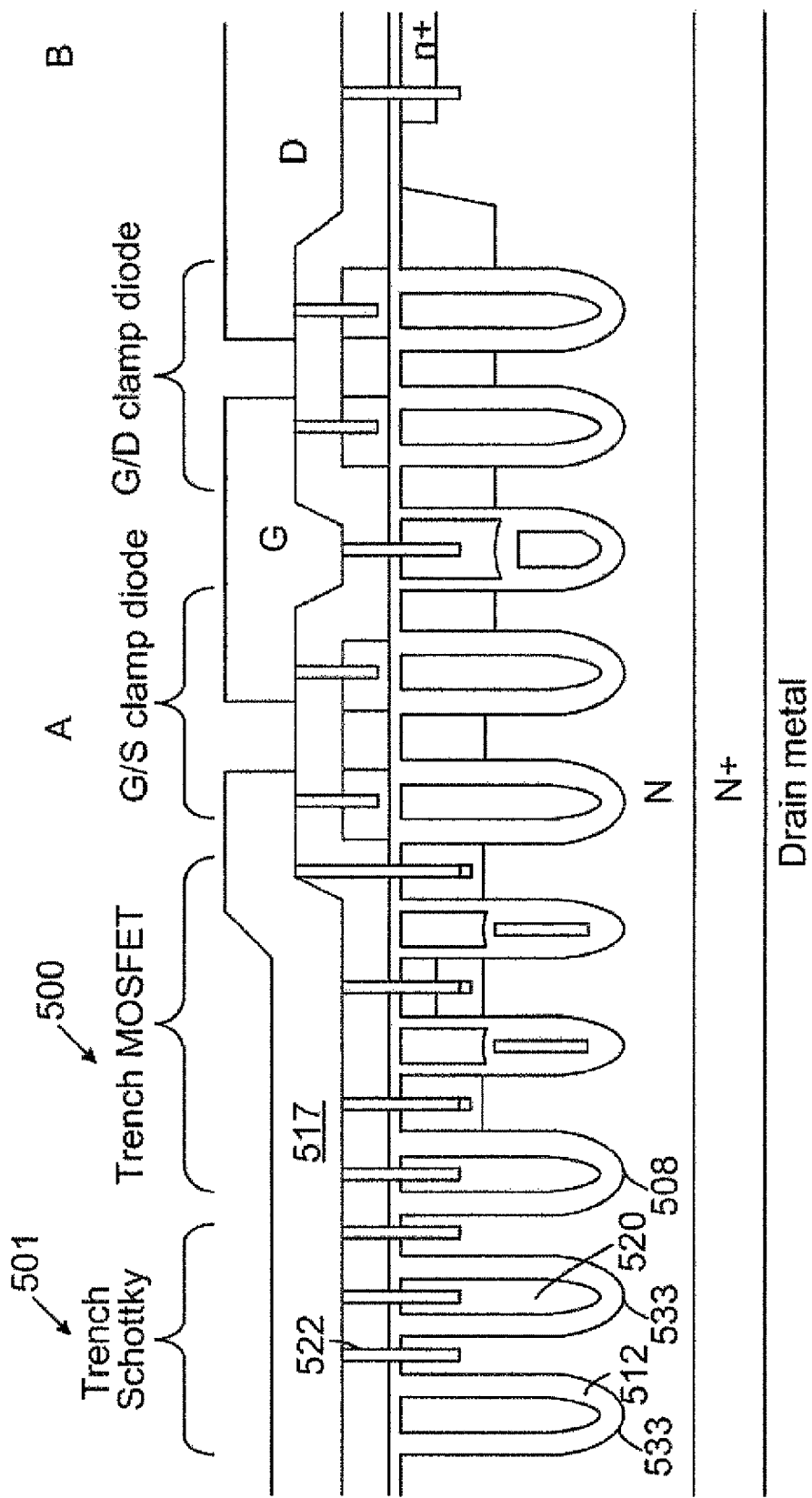
FIG. 7 is another preferred A-B cross-sectional view of an integrated circuit according to the present invention disclosed in FIG. 2C.

FIG. 7 is another preferred A-B cross section of FIG. 2C which has a similar configuration to FIG. 2A, except that, the integrated circuit in FIG. 7 comprises a trench Schottky rectifier 501 having a Schottky barrier layer lined in the trenched anode contact 522 filled with the contact metal plug and disposed between a pair of third type gate trenches 533. Each the third type gate trench 533 is filled with the single shielded electrode 520 padded by the first type gate oxide 512, having same conductive material and structure as the trenched gate for shielded electrode contact in the second type gate trenches 508 in the trench MOSFET 500. Meanwhile, the single shielded electrode 520 in the third type gate trench 533 is connected to the source metal 517.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
said gate electrode in said first type gate trench is surrounded by a source region of said first conductivity type encompassed in a body region of a second conductivity type, and said gate electrode is connected to a gate metal; and
said shielded electrode in said first type gate trench is surrounded by said epitaxial layer and is connected to a source metal;
(d) a Schottky rectifier extending into said epitaxial layer and having a Schottky barrier layer lined in a trenched anode contact filled with a contact metal plug;
(e) a Gate-Drain clamp diode comprising multiple back to back poly-silicon Zener diodes with alternating doped regions of said first conductivity type next to said second conductivity type, connected with said gate metal on one side, and with a drain metal on another side through a plurality of metal stripes cross over a termination area; and
(f) a Gate-Source Clamp diode comprising multiple back to back poly-silicon Zener diodes with alternating doped regions of said first conductivity type next to said second conductivity type, connected with said gate metal on one side, and with said source metal on another side.

2. The integrated circuit of claim 1 wherein:
said trench MOSFET further comprises a second type gate trench connected to said first type gate trench and filled with a single shielded electrode having the same conductive material as said shielded electrode in said shielded trenched gates in said trench MOSFET, padded by said first type gate oxide, wherein said single shielded electrode in said second type gate trench connected to said source metal through a trenched shielded electrode contact filled with said contact metal plug.

3. The integrated circuit of claim 1 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a single shielded electrode having the same conductive material as said shielded electrode in said shielded trenched gates in said trench MOSFET, padded by said first type gate oxide.

4. The integrated circuit of claim 1 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a gate electrode and a shielded electrode having the same conductive material and structure as said shielded trenched gates in said trench MOSFET.

5. The integrated circuit of claim 1 wherein:
said Schottky rectifier is a Junction Barrier Schottky rectifier having a Schottky barrier layer lined in said trenched anode contact filled with said contact metal plug and between a pair of adjacent said body regions.

6. The integrated circuit of claim 1 wherein:
said Schottky rectifier further comprises a Schottky barrier height enhancement region of said first conductivity type surrounding sidewalls and bottom of each said trenched anode contact in said epitaxial layer, wherein said Schottky barrier height enhancement region has a doping concentration lower than said epitaxial layer.

7. The integrated circuit of claim 1 wherein:
said Schottky rectifier further comprises a Schottky barrier height enhancement region of said second conductivity type surrounding sidewalls and bottom of each said trenched anode contact in said epitaxial layer.

8. The integrated circuit of claim 1 wherein:
said Gate-Source clamp diode is connected to said source metal through a first trenched diode contact filled with said contact metal plug, and is connected to said gate metal through a second trenched diode contact filled with said contact metal plug, and
said Gate-Drain clamp diode is connected to said gate metal through a third trenched diode contact filled with said contact metal plug, and is connected to said drain metal through a fourth trenched diode contact filled with said contact metal plug.

9. The integrated circuit of claim 8 further comprising etch-buffer trenched gates disposed in said epitaxial layer underneath each of said first, second, third and fourth trenched diode contacts to serve as buffer layer for prevention of gate-body shortage.

10. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
said gate electrode in said first type gate trench is surrounded by a source region of said first conductivity type encompassed in a body region of a second conductivity type, and said gate electrode is connected to a gate metal; and
said shielded electrode in said first type gate trench is surrounded by said epitaxial layer and is connected to a source metal;
(d) a Schottky rectifier extending into said epitaxial layer and having a Schottky barrier layer lined in a trenched anode contact filled with a contact metal plug; and
(e) a Gate-Source Clamp diode comprising multiple back to back poly-silicon Zener diodes with alternating doped regions of said first conductivity type next to said second conductivity type, connected with said gate metal on one side, and with said source metal on another side.

11. The integrated circuit of claim 10 wherein:
said trench MOSFET further comprises a second type gate trench connected to said first type gate trench and filled with a single shielded electrode having same conductive material as said shielded electrode in said shielded trenched gates in said trench MOSFET, padded by said first type gate oxide, said single shielded electrode in said second type gate trench connected to said source metal through a trenched shielded electrode contact filled with said contact metal plug.

12. The integrated circuit of claim 10 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a single shielded electrode having the same conductive material as said shielded electrode in said shielded trenched gates in said trench MOSFET, padded by said first type gate oxide.

13. The integrated circuit of claim 10 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a gate electrode and a shielded electrode having the same conductive material and structure as said shielded trenched gates in said trench MOSFET.

14. The integrated circuit of claim 10 wherein:
said Schottky rectifier is a Junction Barrier Schottky rectifier having a Schottky barrier layer lined in said trenched anode contact filled with said contact metal plug and between a pair of adjacent said body regions.

15. The integrated circuit of claim 10 wherein:
said Schottky rectifier further comprises a Schottky barrier height enhancement region of said first conductivity type surrounding sidewalls and bottom of each said trenched anode contact in said epitaxial layer, wherein said Schottky barrier height enhancement region has a doping concentration lower than said epitaxial layer.

16. The integrated circuit of claim 10 wherein:
said Schottky rectifier further comprises a Schottky barrier height enhancement region of said second conductivity type surrounding sidewalls and bottom of each said trenched anode contact in said epitaxial layer.

17. The integrated circuit of claim 10 wherein:
said Gate-Source clamp diode is connected to said source metal through a first trenched diode contact filled with said contact metal plug, and is connected to said gate metal through a second trenched diode contact filled with said contact metal plug.

18. The integrated circuit of claim 17 further comprising etch-buffer trenched gates disposed in said epitaxial layer underneath each of said first and second trenched diode contacts to serve as buffer layer for prevention of gate-body shortage.

19. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
   each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
   each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
   said gate electrode in said first type gate trench is surrounded by a source region of said first conductivity type encompassed in a body region of a second conductivity type, and said gate electrode being is connected to a gate metal; and
   said shielded electrode in said first type gate trench is surrounded by said epitaxial layer and is connected to a source metal;
(d) a Schottky rectifier extending into said epitaxial layer and having a Schottky barrier layer lined in a trenched anode contact filled with a contact metal plug; and
(e) a Gate-Drain clamp diode comprising multiple back to back poly-silicon Zener diodes with alternating doped regions of said first conductivity type next to said second conductivity type, connected with said gate metal on one side, and with a drain metal on another side through a plurality of metal stripes cross over a termination area.

20. The integrated circuit of claim 19 wherein:
said trench MOSFET further comprises a second type gate trench connected to said first type gate trench and filled with a single shielded electrode having same conductive material as said shielded electrode in said shielded trenched gates in said trench MOSFET, padded by said first type gate oxide, wherein said single shielded electrode in said second type gate trench is connected to said source metal through a trenched shielded electrode contact filled with said contact metal plug.

21. The integrated circuit of claim 19 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a single shielded electrode having the same conductive material as said shielded electrode in said shielded trenched gates in said trench MOSFET, padded by said first type gate oxide.

22. The integrated circuit of claim 19 wherein:
said Schottky rectifier is a trench Schottky rectifier having a Schottky barrier layer lined in said trenched anode contact filled with said contact metal plug, and disposed between a pair of adjacent third type gate trenches, wherein each of said third type gate trenches is filled with a gate electrode and a shielded electrode having the same conductive material and structure as said shielded trenched gates in said trench MOSFET.

23. The integrated circuit of claim 19 wherein:
said Schottky rectifier is a Junction Barrier Schottky rectifier having a Schottky barrier layer lined in said trenched anode contact filled with said contact metal plug and between a pair of adjacent said body regions.

24. The integrated circuit of claim 19 wherein:
said Schottky rectifier further comprises a Schottky barrier height enhancement region of said first conductivity type surrounding sidewalls and bottom of each said trenched anode contact in said epitaxial layer, wherein said Schottky barrier height enhancement region has a doping concentration lower than said epitaxial layer.

25. The integrated circuit of claim 19 wherein:
said Schottky rectifier further comprises a Schottky barrier height enhancement region of said second conductivity type surrounding sidewalls and bottom of each said trenched anode contact in said epitaxial layer.

26. The integrated circuit of claim 19 wherein:
said Gate-Drain clamp diode is connected to said gate metal through a first trenched diode contact filled with said contact metal plug, and is connected to said drain metal through a second trenched diode contact filled with said contact metal plug.

27. The integrated circuit of claim 26 further comprising etch-buffer trenched gates disposed in said epitaxial layer underneath each of said first and second trenched diode contacts to serve as buffer layer for prevention of gate-body shortage.

28. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
   each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
   each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
   said gate electrode in said first type gate trench is surrounded by a source region of said first conductivity type encompassed in a body region of a second conductivity type, and said gate electrode is connected to a gate metal; and
   said shielded electrode in said first type gate trench is surrounded by said epitaxial layer and is connected to a source metal;
(d) a Gate-Drain clamp diode comprising multiple back to back poly-silicon Zener diodes with alternating doped regions of said first conductivity type next to said second conductivity type, connected with said gate metal on one side, and with a drain metal on another side through a plurality of metal stripes cross over a termination area; and
(e) a Gate-Source Clamp diode comprising multiple back to back poly-silicon Zener diodes with alternating doped regions of said first conductivity type next to said second conductivity type, connected with said gate metal on one side, and with said source metal on another side.

29. The integrated circuit of claim 28 wherein:
said trench MOSFET further comprises a second type gate trench connected to said first type gate trench and filled with a single shielded electrode having same conductive material as said shielded electrode in said shielded trenched gates in said trench MOSFET, padded by said first type gate oxide, wherein said single shielded electrode in said second type gate trench is connected to said source metal through a trenched shielded electrode contact filled with said contact metal plug.

30. The integrated circuit of claim 28 wherein:
said Gate-Source clamp diode is connected to said source metal through a first trenched diode contact filled with contact metal plug, and is connected to said gate metal through a second trenched diode contact filled with said contact metal plug, and
said Gate-Drain clamp diode is connected to said gate metal through a third trenched diode contact filled with said contact metal plug, and is connected to said drain metal through a fourth trenched diode contact filled with said contact metal plug.

31. The integrated circuits of claim 30 further comprising etch-buffer trenched gates disposed in said epitaxial layer underneath each of said first, second, third and fourth trenched diode contacts to serve as buffer layer for prevention of gate-body shortage.

32. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
said gate electrode in said first type gate trench is surrounded by a source region of said first conductivity type encompassed in a body region of a second conductivity type, and said gate electrode is connected to a gate metal; and
said shielded electrode in said first type gate trench is surrounded by said epitaxial layer and is connected to a source metal; and
(d) a Gate-Source Clamp diode comprising multiple back to back poly-silicon Zener diodes with alternating doped regions of said first conductivity type next to said second conductivity type, connected with gate metal on one side, and with said source metal on another side.

33. The integrated circuit of claim 32 wherein:
said trench MOSFET further comprises a second type gate trench connected to said first type gate trench and filled with a single shielded electrode having the same conductive material as said shielded electrode in said shielded trenched gates in said trench MOSFET, padded by said first type gate oxide, wherein said single shielded electrode in said second type gate trench is connected to said source metal through a trenched shielded electrode contact filled with said contact metal plug.

34. The integrated circuit of claim 32 wherein:
said Gate-Source clamp diode is connected to said source metal through a first trenched diode contact filled with contact metal plug, and is connected to said gate metal through a second trenched diode contact filled with said contact metal plug.

35. The integrated circuits of claim 34 further comprising etch-buffer trenched gates disposed in said epitaxial layer underneath each of said first and second trenched diode contacts to serve as buffer layer for prevention of gate-body shortage.

36. An integrated circuit comprising:
(a) a substrate of a first conductivity type;
(b) an epitaxial layer of said first conductivity type over said substrate, said epitaxial layer having a lower doping concentration than said substrate;
(c) a trench MOSFET comprising a plurality of shielded trenched gates in said epitaxial layer, wherein:
each said shielded trenched gate comprises a gate electrode disposed in the upper portion and a shielded electrode disposed in the lower portion of a first type gate trench, wherein said gate electrode and said shielded electrode are insulated from each other by an inter-electrode insulation layer;
each said shielded trenched gate comprises a first type gate oxide surrounding bottom and sidewalls of said shielded electrode and a second type gate oxide along sidewalls of said gate electrode, wherein said first type gate oxide is thicker than said second type gate oxide;
said gate electrode in said first type gate trench is surrounded by a source region of said first conductivity type encompassed in a body region of a second conductivity type, and said gate electrode is connected to a gate metal; and
said shielded electrode in said first type gate trench is surrounded by said epitaxial layer and is connected to a source metal; and
(d) a Gate-Drain clamp diode comprising multiple back to back poly-silicon Zener diodes with alternating doped regions of said first conductivity type next to said second conductivity type, connected with said gate metal on one side, and with a drain metal on another side through a plurality of metal stripes cross over termination area.

37. The integrated circuit of claim 36 wherein:
said trench MOSFET further comprises a second type gate trench connected to said first type gate trench and filled with a single shielded electrode having same conductive material as said shielded electrode in said shielded trenched gates in said trench MOSFET, padded by said first type gate oxide, wherein said single shielded electrode in said second type gate trench is connected to said source metal through a trenched shielded electrode contact filled with said contact metal plug.

38. The integrated circuit of claim 1 wherein:
said Gate-Drain clamp diode is connected to said gate metal through a first trenched diode contact filled with contact metal plug, and is connected to said drain metal through a second trenched diode contact filled with said contact metal plug.

39. The integrated circuit of claim 38 further comprising etch-buffer trenched gates disposed in said epitaxial layer underneath each of said first and second trenched diode contacts to serve as buffer layer for prevention of gate-body shortage.

* * * * *